(12) United States Patent
Kimura et al.

(10) Patent No.: US 6,258,291 B1
(45) Date of Patent: Jul. 10, 2001

(54) PIEZOELECTRIC CERAMIC COMPOSITION AND PIEZOELECTRIC CERAMIC DEVICE USING THE SAME

(75) Inventors: Masahiko Kimura, Kusatsu; Akira Ando, Omihachiman; Takuya Sawada, Moriyama; Koichi Hayashi, Shiga-ken, all of (JP)

(73) Assignee: Murata Manufacturing Co., Ltd (JP)

( * ) Notice: Subject to any disclaimer, the term of this patent is extended or adjusted under 35 U.S.C. 154(b) by 0 days.

(21) Appl. No.: 09/499,220

(22) Filed: Feb. 7, 2000

(30) Foreign Application Priority Data

| Feb. 8, 1999 | (JP) | 11-030323 |
| May 19, 1999 | (JP) | 11-138164 |
| Oct. 13, 1999 | (JP) | 11-291255 |
| Jan. 17, 2000 | (JP) | 2000-007999 |

(51) Int. Cl.⁷ .............. H01B 3/12; H01G 4/12; H01L 41/00; H03H 9/00
(52) U.S. Cl. ................ 252/62.9 R; 501/135
(58) Field of Search ................ 501/135; 252/62.9 R

(56) References Cited

U.S. PATENT DOCUMENTS

| 4,978,646 | 12/1990 | Bardhan et al. | 501/134 |
| 6,117,354 | * 9/2000 | Kimura et al. | 252/62.9 R |

OTHER PUBLICATIONS

Database WPI, Section Ch, Week 199703; Derwent Publications, Ltd., London GB; Class L03, An 1997–029376; XP002143528 & JP 08 290964 A (Sumitomo Chem. Co., Ltd.) Nov. 5, 1996; Abstract.

* cited by examiner

Primary Examiner—C. Melissa Koslow
(74) Attorney, Agent, or Firm—Ostrolenk, Faber, Gerb & Soffen, LLP

(57) ABSTRACT

A lead-free piezoelectric ceramic composition is composed of a main component represented by the general formula $(Sr_{1-x}M1_x)Bi_2(Nb_{1-y}W_y)_2O_9$, wherein M1 is one of divalent metals other than Sr and trivalent metals other than Bi, $0<x\leq0.3$, and $0<y\leq0.3$. Examples of the divalent metals and trivalent metals include Ca, Ba, Mg, La, Ce, Pr, Nd, Sm, Gd, Dy, Er, Yb, Sc and Y. The piezoelectric ceramic composition can be sintered at a relatively low temperature of 1,100° C. or less, and has an electromechanical coupling coefficient kt which is at a practical level. The piezoelectric ceramic composition may be used in piezoelectric ceramic filters, piezoelectric ceramic oscillators and piezoelectric ceramic vibrators.

18 Claims, 1 Drawing Sheet

PIEZOELECTRIC CERAMIC COMPOSITION AND PIEZOELECTRIC CERAMIC DEVICE USING THE SAME

BACKGROUND OF THE INVENTION

1. Field of the Invention

The present invention relates to piezoelectric ceramic compositions and piezoelectric ceramic devices using the same. In particular, the present invention relates to piezoelectric ceramic compositions, which are useful as materials for piezoelectric ceramic filters, piezoclectric ceramic oscillators and piezoelectric ceramic vibrators, and relates to piezoelectric ceramic devices using the same.

2. Description of the Related Art

Piezoelectric ceramic compositions comprising lead titanate zirconate ($Pb(Ti_xZr_{1-x})O_3$) or lead titanate ($PbTiO_3$) as main components are extensively used in piezoclectric ceramic filters, piezoelectric ceramic oscillators, and piezoelectric ceramic vibrators. In piezoelectric ceramic compositions comprising lead titanate zirconate or lead titanate as the main components, lead oxide is generally used. Lead oxide, however, requires facilities such as filters for removing powdered lead oxide, which is scattered by vaporization during the production steps. Such facilities incur increased production costs. In addition, the vaporization of the lead oxide causes deterioration of the uniformity of product quality.

On the other hand, piezoelectric ceramic compositions comprising bismuth layered compounds such as $(Sr_{1-x}M_x)Bi_2Nb_2O_9$ as main components and Mn as an optional component do not contain lead oxide and do not cause the above problems. These piezoelectric ceramic compositions, however, must be sintered at high temperatures of at least 1,250° C. in order to obtain piezoelectric ceramics having electromechanical coupling coefficients kt of at least 10%, which are at practical levels. Thus, these piezoelectric ceramic compositions require sintering furnaces which withstand such high-temperature sintering. Moreover, setters and the like for containing the piezoelectric ceramic compositions during sintering have short service lives in high-temperature operation, resulting in increased production costs.

SUMMARY OF THE INVENTION

Accordingly, it is an object of the present invention to provide a piezoelectric ceramic composition which can be sintered at a temperature of 1,100° C. or less, does not contains lead or lead compounds, and exhibits a practical level of electromechanical coupling coefficient kt at such a low sintering temperature. The piezoelectric ceramic composition is useful as materials for piezoelectric ceramic filters, piezoelectric ceramic oscillators and piezoelectric ceramic vibrators.

It is another object of the present invention to provide a piezoelectric ceramic device using the piezoelectric ceramic composition.

According to a first aspect of the present invention, a piezoelectric ceramic composition comprises a main component represented by the general formula $SrBi_2(Nb_{1-x}W_y)_2O_9$, wherein $0<y \leq 0.3$.

According to second aspect of the present invention, a piezoelectric ceramic composition comprises a main component represented by the general formula $(Sr_{1-x}M1_x)Bi_2Nb_{1-y}W_y)_2O_9$, wherein M1 is one of divalent metals other than Sr and trivalent metals other than Bi, $0<x \leq 0.3$, and $0<y \leq 0.3$. The M1 in the general formula may be at least one element selected from the group consisting of Ca, Ba, Mg, La, Ce, Pr, Nd, Sm, Gd, Dy, Er, Yb, Sc and Y.

According to a third aspect of the present invention, a piezoelectric ceramic composition comprises a main component represented by the general formula $(Sr_{1-x}M2_{2x/3})Bi_2(Nb_{1-y}W_y)_2O_9$, wherein M2 is a trivalent metal other than Bi, $0<x \leq 0.45$, and $0<y \leq 0.3$. The M2 in the general formula may be at least one element selected from the group consisting of La, Ce, Pr, Nd, Sm, Gd, Dy, Er, Yb, Sc and Y.

According to a fourth aspect of the present invention, a piezoelectric ceramic composition comprises a main component represented by the general formula $SrBi_2Nb_2O_9$ and more than 0 to about 0.3 mole of W with respect to 1 mole of Bi in the main component. This piezoelectric ceramic composition may further comprise one of divalent metals other than Sr and trivalent metals other than Bi in an amount of more than 0 to about 0.15 mole with respect to 1 mole of Bi in the main component. The divalent metal or the trivalent metal may be at least one element selected from the group consisting of Ca, Ba, Mg, La, Ce, Pr, Nd, Sm, Gd, Dy, Er, Yb, Sc and Y.

The piezoelectric ceramic compositions according to the first to fourth aspects may further comprise manganese as an auxiliary component in an amount of more than 0 to about 1.0 percent by weight calculated as $MnCO_3$.

According to a fifth aspect of the present invention, a piezoelectric ceramic device comprises a piezoelectric ceramic comprising the piezoelectric ceramic composition according to one of the first to fourth aspects, and electrodes.

The above objects, other objects, features and advantages of the present invention will be further apparent from the following preferred embodiments.

DESCRIPTION OF THE PREFERRED EMBODIMENTS

Figure 1:
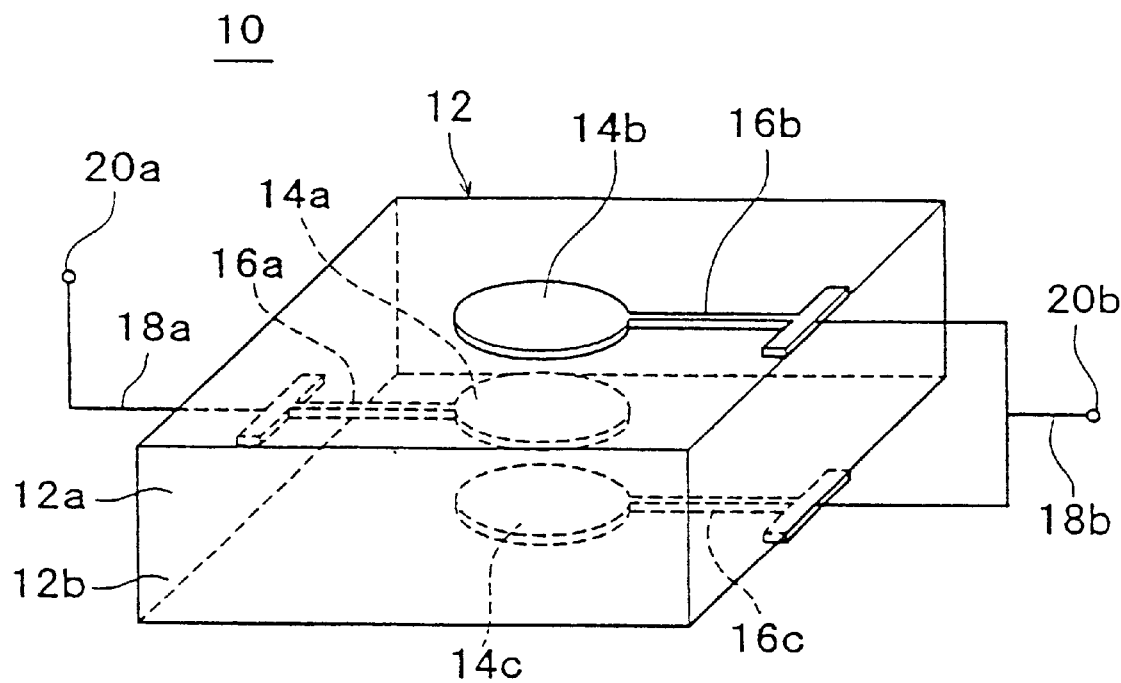
FIG. 1 is an isometric view of an exemplary piezoelectric ceramic vibrator in accordance with the present invention.

The piezoelectric ceramic composition in accordance with the present invention is composed of a main component represented by the general formula $(Sr_{1-x}M_x)Bi_2Nb_2O_9$ wherein M is a divalent metal element other than Sr or a trivalent metal element other than Bi, and $0<x \leq 0.3$. Alternatively, the piezoelectric ceramic composition in accordance with the present invention is composed of a main component represented by the formula $SrBi_2Nb_2O_9$.

In the piezoelectric ceramic composition comprising a main component represented by the general formula $(Sr_{1-x}M1_x)Bi_2(Nb_{1-y}W_y)_2O_9$, the subscript x indicating the M1 content lies in a range of $0<x \leq 0.3$. At an M1 content outside this range, the electromechanical coupling coefficient kt does not reach a practical level.

In the piezoelectric ceramic composition comprising a main component represented by the general formula $(Sr_{1-x}M2_{2x/3})Bi_2(Nb_{1-y}W_y)_2O_9$, the subscript x indicating the M2 content lies in a range of $0<x \leq 0.45$. At an M2 content outside this range, the electromechanical coupling coefficient kt does not reach a practical level.

In the piezoelectric ceramic compositions in accordance with the present invention, the subscript y indicating the W content lies in a range of 0 <y <0.3. When the piezoelectric ceramic composition does not contain W (y=0), this piezoelectric ceramic composition is not sufficiently sintered at a temperature of 1,100° C. or less and is not polarized. When the subscript y exceeds 0.3, the electromechanical coupling coefficient kt does not reach a practical level.

In the piezoelectric ceramic composition comprising a main component represented by the general formula $SrBi_2Nb_2O_9$ and W as an additional component, the W content lies in a range of more than 0 to about 0.3 mole respect to 1 mole of Bi in the main component. When the W content is 0, the piezoelectric ceramic composition is not sufficiently sintered at a temperature of 1,100° C. or less and is not polarized. When the W content exceeds about 0.3 mole, the electromechanical coupling coefficient kt does not reach a practical level.

This piezoelectric ceramic composition may further comprises one of divalent metals other than Sr and trivalent metals other than Bi in an amount of more than 0 to about 0.15 mole with respect to 1 mole of Bi in the main component. When the content of the divalent or trivalent metal exceeds about 0.15 mole, the electromechanical coupling coefficient kt does not reach a practical level.

The piezoelectric ceramic composition in accordance with the present invention preferably further comprises manganese as an auxiliary component in an amount of more than 0 to about 1.0 percent by weight as $MnCO_3$. The addition of manganese contributes to improved sintering characteristics. When the manganese content exceeds about 1.0 percent by weight as $MnCO_3$, the piezoelectric ceramic composition is not polarized.

The advantages in the present invention are particularly noticeable when the MI is at least one element selected from the group consisting of Ca, Ba, Mg, La, Ce, Pr, Nd, Sm, Gd, Dy, Er, Yb, Sc and Y.

Also, the advantages in the present invention are particularly noticeable when the M2 is at least one element selected from the group consisting of La, Ce, Pr, Nd, Sm, Gd, Dy, Er, Yb, Sc and Y.

Moreover, the advantages in the present invention are particularly noticeable when the divalent metal other than Sr or trivalent metal other than Bi is at least one element selected from the group consisting of Ca, Ba, Mg, La, Ce, Pr, Nd, Sm, Gd, Dy, Er, Yb, Sc and Y.

Figure 2:
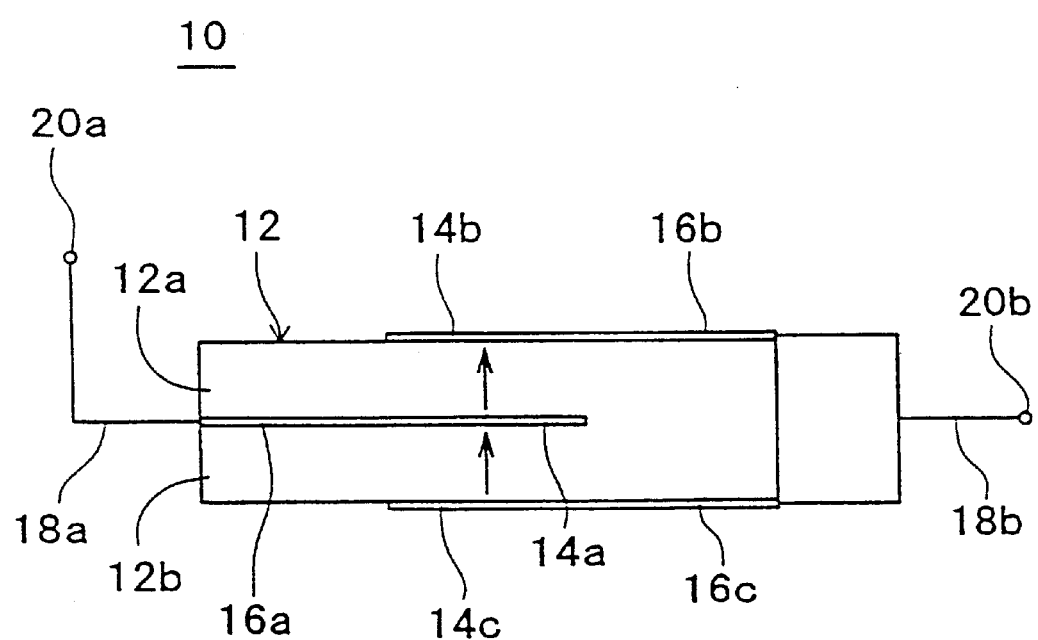
FIG. 2 is a schematic cross-sectional view of the piezoelectric ceramic vibrator shown in FIG. 1.

FIG. 1 is an isometric view of an exemplary piezoelectric ceramic vibrator in accordance with the present invention, and FIG. 2 is a schematic cross-sectional view of the piezoelectric ceramic vibrator. A piezoelectric ceramic vibrator 10 includes, for example, a rectangular piezoelectric ceramic 12. The piezoelectric ceramic 12 has two piezoelectric ceramic layers 12a and 12b. These piezoelectric ceramic layers 12a and 12b are composed of the piezoelectric ceramic composition of the present invention, and are laminated.

Moreover, the piezoelectric ceramic layers 12a and 12b are polarized in the same thickness direction, as shown by the arrows in FIG. 2.

A circular vibrating electrode 14a is formed between the piezoelectric ceramic layers 12a and 12b, and an extraction electrode 16a having a T-shape extends from the vibrating electrode 14a to one end face of the piezoelectric ceramic 12. Another circular vibrating electrode 14b is formed on the piezoelectric ceramic layer 12a, and another extraction electrode 16b having a T-shape extends from the vibrating electrode 14b to the other end face of the piezoelectric ceramic 12. In addition, a third circular vibrating electrode 14c is formed on the piezoelectric ceramic layer 12b, and an extraction electrode 16c having a T-shape extends from the vibrating electrode 14c to the other end face of the piezoelectric ceramic 12.

The extraction electrode 16a is connected to an external terminal 20a via a lead line 18a, whereas the extraction electrodes 16b and 16c are connected to another external terminal 20b via another lead line 18b.

The present invention is not limited to the device configuration shown by the piezoelectric ceramic vibrator 10, and is applicable to other device configurations and other piezoelectric ceramic devices, such as piezoelectric ceramic vibrators using vibrational modes (for example, thickness shear vibration or thickness third harmonic waves), piezoelectric filters and piezoelectric ceramic oscillators.

EXAMPLES

As starting materials, $SrCO_3$, $Bi_2O_3$, $Nb_2O_5$, $CaCO_3$, $BaCO_3$, $La_2O_3$, $Nd_2O_3$, $Sm_2O_3$, $Y_2O_3$, $WO_3$ and $MnCO_3$ were prepared. These materials were weighed and mixed by a wet process in a ball mill for approximately 4 hours so as to have a composition $(Sr_{1-x}M1_x)Bi_2(Nb_{1-y}W_y)_2O_9$+z percent by weight of $MnCO_3$, wherein M1 is one of divalent metals other than Sr and trivalent metals other than Bi $0 \leq x \leq 0.35$, $0 \leq y \leq 0.35$, and $0 \leq z \leq 1.1$, or to have a composition $(Sr_{1-x}M2_{2x/3})Bi_2(Nb_{1-y}W_y)_2O_9$+z percent by weight of $MnCO_3$, wherein M2 is a trivalent metal other than Bi, $0 \leq x \leq 0.5$, $0 \leq y \leq 0.35$, and $0 \leq z \leq 1.1$. The mixture was dried and calcined at 700 to 900° C. The calcined mixture was roughly pulverized and finely pulverized together with a proper amount of organic binder by a wet process for 4 hours. The pulverized powder was screened using a 40-mesh sieve to adjust the particle size. The powder was pressed under a pressure of 1.000 kg/cm² to form a disk with a diameter of 12.5 mm and a thickness of 1 mm. The disk was sintered at 900 to 1,250° C. in the air to form a disk ceramic. A silver paste was applied onto both main faces of the disk ceramic to form silver electrodes. A DC voltage of 5 to 10 kV/mm was applied between the silver electrodes for 10 to 30 minutes in an insulating oil at 150 to 200° C. for polarization. A piezoelectric ceramic sample was thereby prepared. Similarly, piezoelectric ceramic samples were prepared in which the types of the M1 or M2, the M1, the M2 contents (x or k) and the W contents (y) were different.

A half of the subscript x in the above formula $(Sr_{1-x}M1_x)Bi_2(Nb_{1-y}W_y)_2O_9$ correspond to the content of the divalent or trivalent metal with respect to 1 mole of Bi in the above formula fourth aspect. Similarly, one-third of the subscript x in the above formula $(Sr_{1-x}M1_x)Bi_2(Nb_{1-y}W_y)_2O_9$ corresponds to the content of the divalent or trivalent metal with respect to 1 mole of Bi in the main component in the fourth aspect.

The density, resistivity and electromechanical coupling coefficient kt of each sample were measured. Table 1 to 3 show these results, in addition to the type of the M1 or M2, x or k, y, the $MnCO_3$ content and the sintering temperature. In Tables 1 to 3, a Sample No. with an asterisk indicates a sample outside the ranges of the present invention.

TABLE 1

| Sample No. | M1 | x | y | MnCO$_3$ (wt %) | Sintering Temp. (° C.) | Density (g/cm$^3$) | Resistivity (Ω·cm) | kt (%) |
|---|---|---|---|---|---|---|---|---|
| 1* | — | 0 | 0 | 0 | 1,100 | 5.70 | $5.0 \times 10^8$ | Unpolarized |
| 2 | — | 0 | 0.1 | 0 | 1,100 | 6.85 | $3.0 \times 10^{12}$ | 13.1 |
| 3 | — | 0 | 0.3 | 0 | 1,100 | 6.96 | $4.0 \times 10^{12}$ | 11.8 |
| 4* | — | 0 | 0.35 | 0 | 1,100 | 6.80 | $3.0 \times 10^{12}$ | 8.8 |
| 5* | — | 0 | 0 | 0.5 | 1,250 | 6.96 | $6.0 \times 10^{12}$ | 17.6 |
| 6* | — | 0 | 0 | 0.5 | 1,100 | 6.05 | $2.0 \times 10^9$ | Unpolarized |
| 7 | — | 0 | 0.05 | 0.5 | 1,100 | 6.98 | $8.0 \times 10^{12}$ | 17.9 |
| 8 | — | 0 | 0.1 | 0.5 | 1,100 | 7.01 | $6.0 \times 10^{12}$ | 17.3 |
| 9 | — | 0 | 0.1 | 0.5 | 1,000 | 6.99 | $8.0 \times 10^{11}$ | 16.0 |
| 10 | — | 0 | 0.3 | 0.5 | 1,100 | 7.02 | $5.0 \times 10^{12}$ | 15.7 |
| 11* | — | 0 | 0.35 | 0.5 | 1,100 | 6.98 | $2.0 \times 10^{12}$ | 8.1 |
| 12* | — | 0 | 0.35 | 0.5 | 1,000 | 6.65 | $2.0 \times 10^{10}$ | 6.5 |
| 13* | — | 0 | 0.35 | 0.5 | 900 | 5.65 | $5.0 \times 10^8$ | Unpolarized |
| 14* | — | 0 | 0 | 1.0 | 1,100 | 5.98 | $1.0 \times 10^9$ | Unpolarized |
| 15 | — | 0 | 0.3 | 1.0 | 1,100 | 6.97 | $4.0 \times 10^{12}$ | 14.6 |
| 16* | — | 0 | 0.35 | 1.0 | 1,100 | 6.84 | $2.0 \times 10^{12}$ | 8.0 |
| 17 | — | 0 | 0.1 | 1.1 | 1,100 | 6.96 | $7.0 \times 10^9$ | 11.8 |
| 18 | — | 0 | 0.3 | 1.1 | 1,100 | 6.95 | $5.0 \times 10^9$ | 10.8 |
| 19* | Ca | 0.1 | 0 | 0.5 | 1,100 | 6.07 | $4.0 \times 10^9$ | Unpolarized |
| 20 | Ca | 0.1 | 0.1 | 0.5 | 1,100 | 7.05 | $6.0 \times 10^{12}$ | 18.3 |
| 21 | Ca | 0.1 | 0.3 | 0.5 | 1,100 | 7.07 | $6.0 \times 10^{12}$ | 16.6 |
| 22* | Ca | 0.1 | 0.35 | 0.5 | 1,100 | 6.98 | $2.0 \times 10^{12}$ | 9.1 |
| 23* | Ca | 0.3 | 0 | 0.5 | 1,100 | 6.07 | $2.0 \times 10^{13}$ | Unpolarized |
| 24 | Ca | 0.3 | 0.1 | 0.5 | 1,100 | 7.07 | $2.0 \times 10^{13}$ | 20.9 |
| 25 | Ca | 0.3 | 0.3 | 0.5 | 1,100 | 7.07 | $1.0 \times 10^{13}$ | 19.1 |

TABLE 2

| Sample No. | M1 | x | y | MnCO$_3$ (wt %) | Sintering Temp. (° C.) | Density (g/cm$^3$) | Resistivity (Ω·cm) | kt (%) |
|---|---|---|---|---|---|---|---|---|
| 26* | Ca | 0.3 | 0.35 | 0.5 | 1,100 | 7.05 | $2.0 \times 10^{12}$ | 9.4 |
| 27 | Ca | 0.35 | 0.1 | 0.5 | 1,100 | 6.67 | $9.0 \times 10^{10}$ | 10.3 |
| 28 | Ca | 0.35 | 0.3 | 0.5 | 1,100 | 6.55 | $5.0 \times 10^{10}$ | 10.1 |
| 29* | Ba | 0.1 | 0 | 0.5 | 1,100 | 6.06 | $4.0 \times 10^9$ | Unpolarized |
| 30 | Ba | 0.1 | 0.1 | 0.5 | 1,100 | 7.05 | $6.0 \times 10^{12}$ | 18.0 |
| 31 | Ba | 0.1 | 0.3 | 0.5 | 1,100 | 7.05 | $6.0 \times 10^{12}$ | 16.1 |
| 32* | Ba | 0.1 | 0.35 | 0.5 | 1,100 | 6.98 | $9.0 \times 10^{11}$ | 8.1 |
| 33* | La | 0.1 | 0 | 0.5 | 1,100 | 6.03 | $4.0 \times 10^9$ | Unpolarized |
| 34 | La | 0.1 | 0.1 | 0.5 | 1,100 | 7.00 | $6.0 \times 10^{12}$ | 17.6 |
| 35 | La | 0.1 | 0.3 | 0.5 | 1,100 | 7.02 | $6.0 \times 10^{12}$ | 16.0 |
| 36* | La | 0.1 | 0.35 | 0.5 | 1,100 | 6.80 | $1.0 \times 10^{12}$ | 7.8 |
| 37* | Nd | 0.1 | 0 | 0.5 | 1,100 | 6.05 | $4.0 \times 10^9$ | Unpolarized |
| 38 | Nd | 0.1 | 0.1 | 0.5 | 1,100 | 7.05 | $6.0 \times 10^{12}$ | 17.7 |
| 39 | Nd | 0.1 | 0.3 | 0.5 | 1,100 | 7.06 | $6.0 \times 10^{12}$ | 15.9 |
| 40* | Nd | 0.1 | 0.35 | 0.5 | 1,100 | 6.89 | $9.0 \times 10^{11}$ | 7.6 |
| 41* | Sm | 0.1 | 0 | 0.5 | 1,100 | 6.00 | $4.0 \times 10^9$ | Unpolarized |
| 42 | Sm | 0.1 | 0.1 | 0.5 | 1,100 | 7.10 | $6.0 \times 10^{12}$ | 17.9 |
| 43 | Sm | 0.1 | 0.3 | 0.5 | 1,100 | 7.08 | $6.0 \times 10^{12}$ | 16.1 |
| 44* | Sm | 0.1 | 0.35 | 0.5 | 1,100 | 7.00 | $9.0 \times 10^{11}$ | 8.0 |
| 45* | Y | 0.1 | 0 | 0.5 | 1,100 | 6.06 | $4.0 \times 10^9$ | Unpolarized |
| 46 | Y | 0.1 | 0.1 | 0.5 | 1,100 | 7.09 | $6.0 \times 10^{12}$ | 17.9 |
| 47 | Y | 0.1 | 0.3 | 0.5 | 1,100 | 7.06 | $6.0 \times 10^{12}$ | 15.7 |
| 48* | Y | 0.1 | 0.35 | 0.5 | 1,100 | 6.92 | $2.0 \times 10^{12}$ | 7.9 |

TABLE 3

| Sample No. | M$_2$ | x' | y | MnCO$_3$ (wt %) | Sintering Temp. (° C.) | Density (g/cm$^3$) | Resistivity (Ω·cm) | kt (%) |
|---|---|---|---|---|---|---|---|---|
| 49* | La | 0.15 | 0 | 0.5 | 1,100 | 6.01 | $2.0 \times 10^9$ | Unpolarized |
| 50 | La | 0.15 | 0.1 | 0.5 | 1,100 | 6.87 | $4.0 \times 10^{12}$ | 15.8 |
| 51 | La | 0.15 | 0.3 | 0.5 | 1,100 | 6.75 | $4.0 \times 10^{12}$ | 14.3 |
| 52* | La | 0.15 | 0.35 | 0.5 | 1,100 | 6.52 | $5.0 \times 10^{11}$ | 7.2 |
| 53* | La | 0.45 | 0 | 0.5 | 1,100 | 5.99 | $1.0 \times 10^9$ | Unpolarized |
| 54 | La | 0.45 | 0.1 | 0.5 | 1,100 | 6.75 | $4.0 \times 10^{12}$ | 14.7 |
| 55 | La | 0.45 | 0.3 | 0.5 | 1,100 | 6.76 | $4.0 \times 10^{12}$ | 13.9 |
| 56* | La | 0.45 | 0.35 | 0.5 | 1,100 | 6.29 | $4.0 \times 10^{11}$ | 6.6 |

TABLE 3-continued

| Sample No. | $M_2$ | x' | y | $MnCO_3$ (wt %) | Sintering Temp. (° C.) | Density (g/cm$^3$) | Resistivity (Ω · cm) | kt (%) |
|---|---|---|---|---|---|---|---|---|
| 57 | La | 0.5 | 0.1 | 0.5 | 1,100 | 6.50 | $4.0 \times 10^9$ | 10.4 |
| 58* | Nd | 0.15 | 0 | 0.5 | 1,100 | 5.98 | $2.0 \times 10^9$ | Unpolarized |
| 59 | Nd | 0.15 | 0.1 | 0.5 | 1,100 | 6.90 | $4.0 \times 10^{12}$ | 15.9 |
| 60 | Nd | 0.15 | 0.3 | 0.5 | 1,100 | 6.86 | $4.0 \times 10^{12}$ | 14.7 |
| 61* | Nd | 0.15 | 0.35 | 0.5 | 1,100 | 6.59 | $5.0 \times 10^{11}$ | 7.9 |

As shown in Tables 1 to 3, the samples in accordance with the present invention have electromechanical coupling coefficients kt which are at practical levels when the samples are sintered at a temperature of 1,100° C. or less.

The piezoelectric ceramic composition in accordance with the present invention is not limited to the above EXAMPLES and may have other formulations within the scope of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric ceramic composition comprising a main component represented by the general formula $(Sr_{1-x}M1_x)Bi_2(Nb_{1-y}W_y)_2O_9$, wherein M1 is at least one element selected from the group consisting of divalent metals other than Sr and trivalent metals other than Bi, $0 \leq x \leq 0.3$, and $0 < y \leq 0.3$.

2. A piezoelectric ceramic composition according to claim 1, further comprising manganese as an auxiliary component in an amount of more than 0 to about 1.0 percent by weight calculated as $MnCO_3$.

3. A piezoelectric ceramic composition according to claim 1 wherein x is 0 and the main component is represented by the general formula $SrBi_2(Nb_{1-y}W_y)_2O_9$.

4. A piezoelectric ceramic composition according to claim 1, wherein said M1 is at least one element selected from the group consisting of Ca, Ba, Mg, La, Ce, Pr, Nd, Sm, Gd, Dy, Er, Yb, Sc and Y.

5. A piezoelectric ceramic composition according to claim 1, wherein said M1 is selected from the group consisting of Ca, Ba, La, Nd, Sm and Y.

6. A piezoelectric ceramic composition according to claim 1 comprising a main component represented by the general formula $(Sr_{1-x}M1_{2x/3})Bi_2(Nb_{1-y}W_y)_2O_9$, wherein M1 is a trivalent metal other than Bi, and $0 < x \leq 0.45$.

7. A piezoelectric ceramic composition according to claim 6, wherein M1 is at least one element selected from the group consisting of La, Ce, Pr, Nd, Sm, Gd, Dy, Er, Yb, Sc and Y.

8. A piezoelectric ceramic composition according to claim 6, wherein M1 is La or Nd.

9. A piezoelectric ceramic composition comprising a main component represented by the general formula $SrBi_2Nb_2O_9$ and containing more than 0 to about 0.3 mole of W with respect to 1 mole of Bi in the main component.

10. A piezoelectric ceramic composition according to claim 9, further comprising a divalent metal other than Sr or trivalent metal other than Bi in an amount of more than 0 to about 0.15 mole with respect to 1 mole of Bi in the main component.

11. A piezoelectric ceramic composition according to claim 10, wherein said divalent metal other than Sr or trivalent metal other than Bi is at least one element selected from the group consisting of Ca, Ba, Mg, La, Ce, Pr, Nd, Sm, Gd, Dy, Er, Yb, Sc and Y.

12. A piezoelectric ceramic composition according to claim 9, further comprising manganese as an auxiliary component in an amount of more than 0 to about 1.0 percent by weight calculated as $MnCO_3$.

13. A piezoelectric ceramic device comprising:
a piezoelectric ceramic comprising a piezoelectric ceramic composition according to claim 12; and
a pair of electrodes thereon.

14. A piezoelectric ceramic device comprising:
a piezoelectric ceramic comprising a piezoelectric ceramic composition according to claim 9; and
a pair of electrodes thereon.

15. A piezoelectric ceramic device comprising:
a piezoelectric ceramic comprising a piezoelectric ceramic composition according to claim 6; and
a pair of electrodes thereon.

16. A piezoelectric ceramic device comprising:
a piezoelectric ceramic comprising a piezoelectric ceramic composition according to claim 3; and
a pair of electrodes thereon.

17. A piezoelectric ceramic device comprising:
a piezoelectric ceramic comprising a piezoelectric ceramic composition according to claim 2; and
a pair of electrodes thereon.

18. A piezoelectric ceramic device comprising:
a piezoelectric ceramic comprising a piezoelectric ceramic composition according to claim 1; and
a pair of electrodes thereon.

* * * * *